United States Patent [19]

Hoffmann

[11] Patent Number: 4,986,939
[45] Date of Patent: Jan. 22, 1991

[54] METHOD FOR THE PRODUCTION OF CYLINDRICALLY SYMMETRIC BODIES WITH A RADIAL GRADIENT

[75] Inventor: Hans-Jurgen Hoffmann, Konstantinweg, Fed. Rep. of Germany

[73] Assignee: Schott Glaswerke, Mainz, Fed. Rep. of Germany

[21] Appl. No.: 52,055

[22] Filed: May 20, 1987

[30] Foreign Application Priority Data

May 23, 1986 [DE] Fed. Rep. of Germany ....... 3617363

[51] Int. Cl.$^5$ .................... B29C 53/14; C03B 37/025
[52] U.S. Cl. .................... 264/1.7; 264/1.8; 264/2.7; 264/158; 264/235; 264/245; 264/339; 65/3.11; 65/4.1; 65/4.2; 65/4.3; 65/3.15; 65/4.21; 65/31
[58] Field of Search ............. 264/339, 1.2, 245, 1.5, 264/1.7, 1.8, 2.7, 157, 158, 159, 246, 248, 345, 346, 234, 235; 65/3.11, 4.1, 4.2, 4.21, 4.3, 31, 3.15

[56] References Cited

U.S. PATENT DOCUMENTS

| | | | |
|---|---|---|---|
| 1,989,371 | 1/1935 | Land | 264/1.2 |
| 2,608,722 | 9/1952 | Stuctzer | 264/1.2 |
| 3,454,332 | 7/1969 | Siegel | 264/1.7 |
| 3,699,647 | 10/1972 | Bidault | 65/4.1 |
| 3,779,729 | 12/1973 | Hicks | 65/4.1 |
| 3,977,855 | 8/1976 | Cole | 65/4.1 |
| 4,123,483 | 10/1978 | Nakahara | 264/1.2 |
| 4,224,373 | 9/1980 | Marzocchi | 65/4.1 |
| 4,243,398 | 1/1981 | Nomura | 65/4.2 |
| 4,261,721 | 4/1981 | Lewis | 65/4.1 |
| 4,291,940 | 9/1981 | Kowasaki | 65/4.2 |
| 4,360,372 | 11/1982 | Maciejko | 65/4.2 |
| 4,426,215 | 1/1984 | Murphy | 65/4.21 |
| 4,427,717 | 1/1984 | Gauthier | 65/3.11 |
| 4,453,962 | 6/1984 | Harada | 65/4.2 |
| 4,460,696 | 7/1984 | Harada | 65/4.2 |
| 4,490,163 | 12/1984 | Jochem | 65/4.2 |
| 4,643,752 | 2/1987 | Howard | 264/1.7 |
| 4,666,234 | 5/1987 | Emkey | 65/4.1 |
| 4,704,151 | 11/1987 | Keck | 65/4.1 |

*Primary Examiner*—Jay H. Woo
*Assistant Examiner*—Jeremiah F. Durkin, II
*Attorney, Agent, or Firm*—Nies, Kurz, Bergert & Tamburro

[57] ABSTRACT

In a method for the production of cylindrically symmetric bodies with given radial gradient of the material properties, for example of the refractive index, at least two rod-shaped molded bodies consisting of materials with different properties are joined in parallel and, following lowering of the viscosity of both materials, the bodies are twisted many times in a spiral around a longitudinal axis, such that a desired radial gradient of the material properties arises, where metallic, semiconducting, or insulating materials may be used, and the viscosity is varied through changing the temperature or adding or removing a solvent.

17 Claims, 3 Drawing Sheets

METHOD FOR THE PRODUCTION OF CYLINDRICALLY SYMMETRIC BODIES WITH A RADIAL GRADIENT

FIELD OF THE INVENTION

The present invention relates to cylindrically symmetric molded bodies with adjustable gradient of the material properties, and methods for making the same.

BACKGROUND OF THE INVENTION

The previous manufacturing methods and the use of materials with a radial gradient of a physical material parameter can be illustrated using the example of the manufacture of gradient-index-lenses. In the case of these lenses, glasses are used that have a radial gradient of the index of refraction. The index of refraction n (r) as a function of the radius r from the midpoint of the discoid lens preferably has a quadratic curve $$n(r) = n_0 + (n_1 - n_0) \frac{r^2}{R^2} \quad (1)$$

where $n_0$ and $n_1$ are, respectively, the indices of refraction in the center at $r=0$ and at the edge at $r=R$.

Such gradient-index-lenses can be manufactured from glass by means of ion exchange. In this process, a cylindrical glass rod is placed in a salt bath, for example, which contains ions that are exchanged for other ions in the glass by means of in- or out-diffusion at high temperatures. Since with the ion exchange the composition of the glass changes in the diffusion zones, the index of refraction also changes with the concentration of ions exchanged at any given time. If the rods are cut into discs and these discs are polished, gradient-index-lenses are obtained. This method has several disadvantages that have prevented a wider use up to now:

(a) The desired n(r) curves can be adjusted to a sufficient precision only with difficulty.
 (b) The diffusion processes run very slowly over great distances, at higher temperatures as well, with the result that long diffusion times are required and gradient-index-lenses are manufactured with only a relatively small diameter.
 (c) The variation $\Delta n$ of the index of refraction due to the ion exchange is small (at a maximum, $\Delta n \approx 0.15$), since only ions with comparatively slight concentration and a small contribution to the electronic polarizability of the glasses can be exchanged.
 (d) Only in the case of a small number of glasses can a sufficient ion exchange be carried out, with the result that only a limited selection of possible dispersion curves n (r, $\lambda$) can be produced. Because of this, the correction possibilities are restricted.

Furthermore, rods having a radial gradient of the index of refraction can be produced by depositing material having variable composition in layers. For this purpose, CVD-methods (chemical vapor deposition), evaporation and similar methods are employed. In order to attain the necessary homogeneity, only a thin layer of material can be deposited at a time in this method, and the composition must change from layer to layer. For this reason, long manufacturing times are required, with the result that these methods are not economically viable in many cases.

OBJECTS AND SUMMARY OF THE PRESENT INVENTION

It is therefore a principal object of the present invention to provide a method by which the stated disadvantages of the previous methods are avoided. This object is attained by uniting in parallel at least two rod-shaped molded bodies having different physical properties, changing the viscosity of the bodies so that the bodies are temporarily converted to plastically deformable states of approximately equal viscosity, twisting the united bodies about a longitudinal axis so that a desired radial gradient of the material properties is achieved, and resolidifying the twisted bodies. With the method of the present invention, a radial variation of many material properties can be set. In the detailed description which follows, the method will be specified in detail using the example of the manufacture of rods with a radial change of the index of refraction n (r).

DETAILED DESCRIPTION OF THE INVENTION

Figure 1:
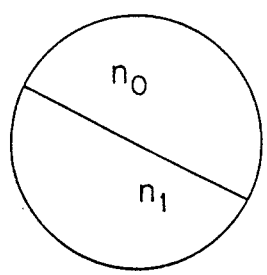
FIG. 1 is a cross-sectional view of a rod formed from materials having different indices of refraction.

FIG. 1 shows the cross section of a rod which is composed symmetrically in equal parts from two materials with the indices of refraction $n_0$ and $n_1$. By means of increasing the temperature, the viscosity of both materials is reduced to the extent that the rod can be twisted permanently around its longitudinal axis. It suffices in so doing that one begins with the heating at one end of the rod and begins to twist the rod there. If the zone of low viscosity, which has been formed by the heating, is moved through the rod to the other end, while the rod continues to be twisted, both of the regions with the indices of refraction $n_0$ and $n_1$ are connected with each other in a spiral shape.

The threads of the spirals become denser as the number of the twisting rotations becomes larger. In this fashion, any desired pitch and homogeneity of the index of refraction can be set. If the pitch is already very small, the homogeneity can be further improved as required by leaving the rod for a still longer time at higher temperatures and favoring in this way an exchange between both materials by means of diffusion.

Whereas the rod according to FIG. 1 consisted of two parts with the indices of refraction $n_0$ and $n_1$, it possesses in the example in question, following twisting, being maintained at a heightened temperature and being cooled, an approximately uniform average index of refraction. If another distribution of the cross-sectional areas of the materials with indices of refraction $n_0$, $n_1$, $n_2$, etc., is chosen, different n (r) relations can be set in manifold ways. Some examples for the distribution of the indices of refraction before twisting are presented in FIGS. 2 to 10.

The corresponding molded bodies of the parts can be produced, for example, by means of drawing, casting, boring, grinding, pressing, extruding or ultrasonic milling. By means of casting or drawing from a double or multiple crucible with suitably shaped nozzles, such profiles can be produced directly with different materials and can be subsequently twisted permanently. If it is assumed that the individual material components with the indices of refraction $n_1$, $n_2$, $n_3$, etc., contribute to the average index of refraction in accordance with their volume percent, the index of refraction n at the distance r is determined by the relative, individual angular fractions $$\frac{\alpha_i}{2\pi}$$

of the corresponding arcs of the circle in accordance with the following equation:

$$n_0 \frac{\alpha_0(r)}{2\pi} + n_1 \frac{\alpha_1(r)}{2\pi} + \ldots = n(r) \quad (2)$$

Figure 2:
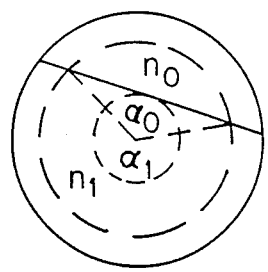
FIGS. 2–10 show cross-sectional views of other rods formed from materials having different indices of refraction.

In FIG. 2, the angles $\alpha_0$ and $\alpha_1$ are drawn in for the materials with the indices of refraction $n_0$ and $n_1$ at the radius r.

If the index of refraction cannot be represented simply as an additive superimposition of the individual components, corrections must be made which can be determined experimentally with sufficient precision.

Of particular practical significance for gradient-index-lenses is the index of refraction profile according to Equation (1). In the case of additive superimposition of the relative portions of two components, such a profile can be achieved when the relative portions amount to $$\frac{\alpha_1}{2\pi} = \frac{r^2}{R^2} \text{ and } \frac{\alpha_0}{2\pi} = \left(1 - \frac{r^2}{R^2}\right), \text{ so that} \quad (3)$$

$$n_0\left(1 - \frac{r^2}{R^2}\right) + n_1\left(\frac{r^2}{R^2}\right) = n_0 + (n_1 - n_0)\frac{r^2}{R^2} = n(r)$$

Figure 3:
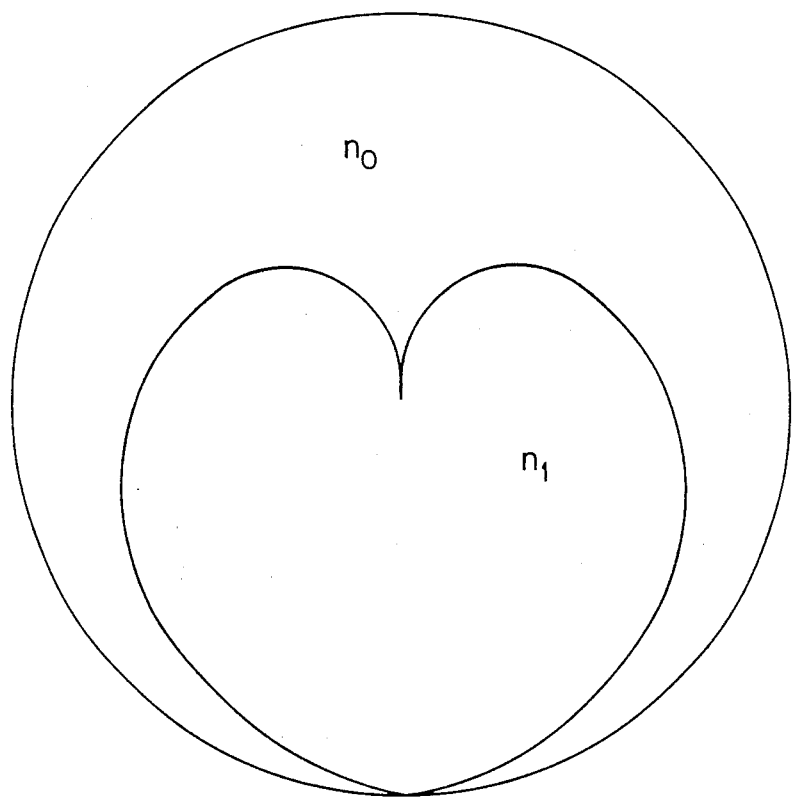
Figure 4:
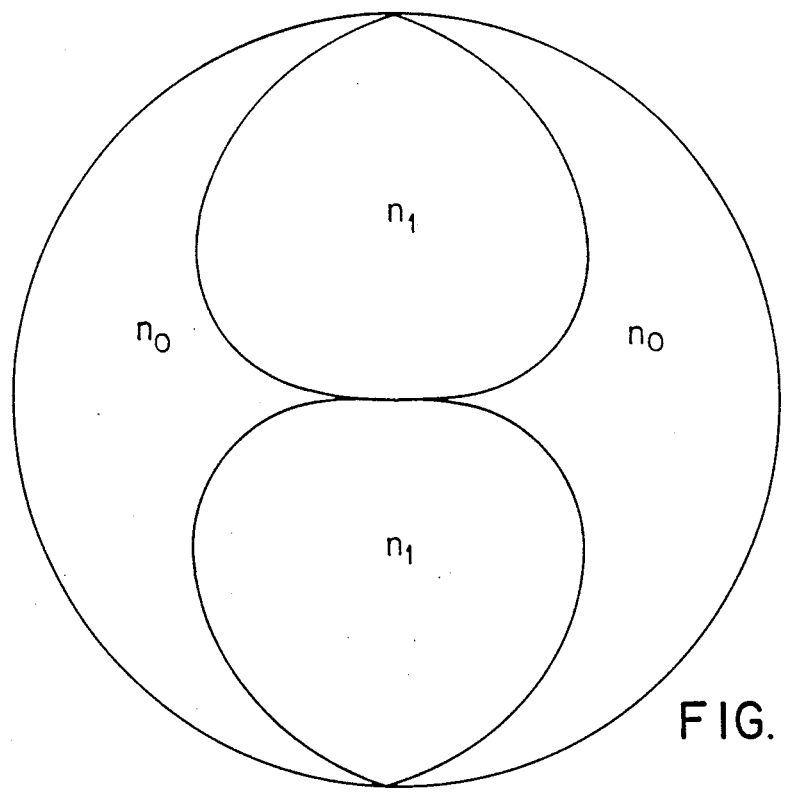
Figure 5:
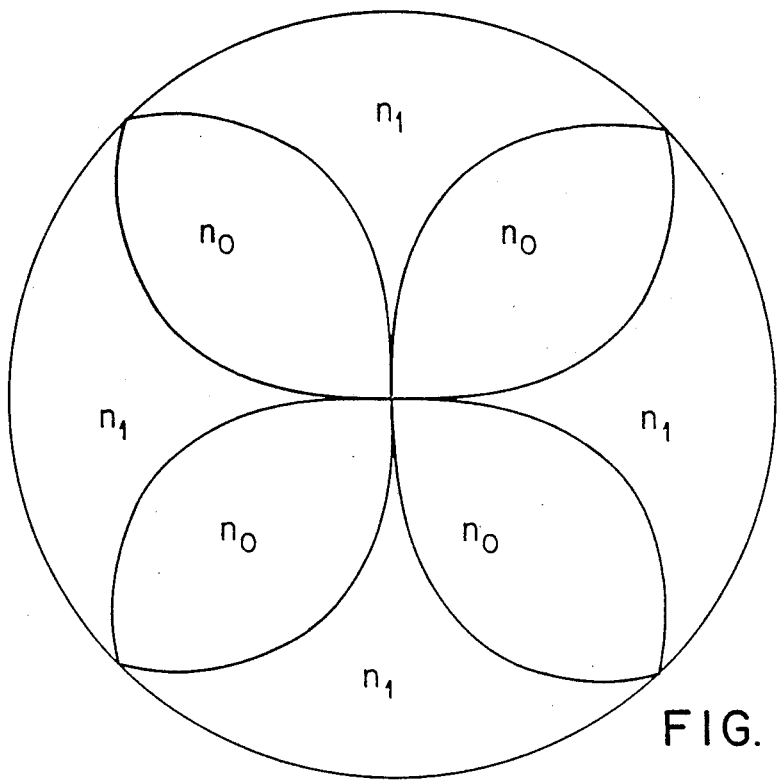

With the aid of this condition, the profiles for both materials with the index of refraction $n_0$ and $n_1$ can be determined before the twisting in various ways. Possible distributions are represented in FIGS. 3 to 5. Here it is a matter of boundary curves, which follow from the condition $$\frac{r^2(\phi)}{R^2} \cdot \frac{\pi}{N} = \pm \phi + 2\pi \cdot \frac{k}{N} \quad (4)$$

with N=1, 2, 3, etc., and k=0, ... N-1 for $0 \leq r \leq R$. In (4), r and $\phi$ signify the polar coordinates of the boundary curves.

FIG. 3 shows the distribution with N=1, FIG. 4 with N=2, and FIG. 5 with N=4. These distributions of the materials with the indices of refraction $n_0$ and $n_1$ in the cross section, however, represent only special cases of the much more general conditions (3). For practical operation, however, it can be advantageous to use the simplest geometric shapes possible as a limitation of the individual components. Actually, any distribution of the materials of different indices of refraction can be approximated sufficiently precisely, for example by means of circular cross sections. Since glasses can be combined not only with different indices of refraction $n_i$, but also with different dispersions, not only an arbitrary multiplicity of various indices of refraction curves n (r) can be produced, but even a multiplicity of dispersion curves n ($\lambda$, r) at the same time. Here, accordingly, an additional degree of freedom is available for the correction of lenses.

Gradient-index-lenses can be produced from a rod, in which n (r) was set in the way described by means of a desired profile of the index of refraction, by sawing it into discs and subsequent polishing. Since the focal length of such a lens depends on its thickness, a continuous focal length variation in the lens can be achieved by shaping the thickness of the lens in the form of a wedge. Furthermore, arbitrary angles of intersection to the axis of the gradient rod can be set. Then the refractive power of the lens is cylindrically distorted. In this way, cylindrical lens corrections can be set in a relatively simple fashion.

Such gradient index lenses can be made antireflection in a well-known manner by means of coating or leaching. Due to the gradient of the index of refraction, the quality of the antireflection also has a slight gradient, which, however, can be neglected in most cases due to its slight effect.

If the rear side of the gradient index lenses is coated with a reflecting coating level concave or convex mirrors can be produced because of the gradient index lens in front. Here as well, the manifold correction possibilities can be used analogously to the gradient index lenses; mirrors are obtained with continuous focal length variation as a function of the spot in the reflection plane, if wedge-shaped gradient index lenses have a reflecting coating applied, and ellipsoid, paraboloid, or hyperboloid mirrors, if lenses, which were not cut vertically to the axis of the gradient rod, have a reflecting coating applied on their rear side. The advantage of these mirrors lies in the fact that they can have level surfaces. This cases the task of production, especially of non-spherical mirrors.

The method described can be used not only for rods with a radial gradient of the index of refraction. For example, several materials having different absorption curves can also be combined and, in this manner, a desired radial distribution of the absorptance can be set. A radial distribution of the concentration of fluorescent 79 ions or particles can also be set purposefully. Thus, for example, the doping density for laser rods can be set purposefully with active ions in such a way that the rods are homogeneously stimulated upon radial pumping. A combination of various fluorescent ions or particles 79 having different concentrations is also possible in this manner in the various parts of a laser rod.

Up to now only the adjustment of radial dependencies of optical properties and possible applications have been described. In principle, however, radial changes of almost all material parameters of solids can be adjusted in the same fashion with the stated method. This is true, for example, for the thermal expansion,
the electrical and thermal conductivity,
the temperature-dependence of the index of refraction, reflectance and absorptance,
the energy gap of crystalline and amorphous semiconductors,
the modulus of elasticity, the rigidity modulus,
the density,
the magnetizability,
the chemical stability.

Figure 6:
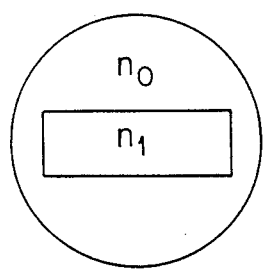
Figure 7:
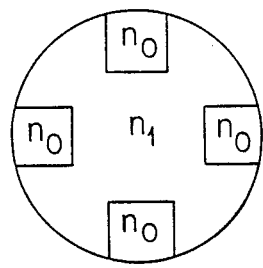
Figure 8:
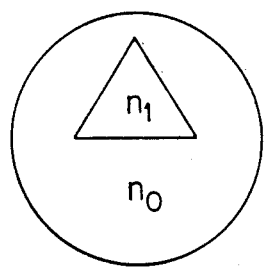
Figure 9:
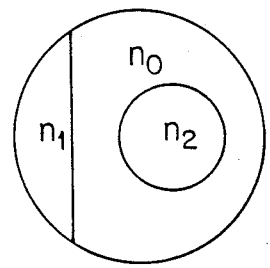
Figure 10:
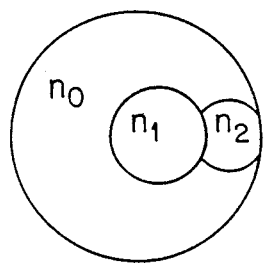
Figure 11:
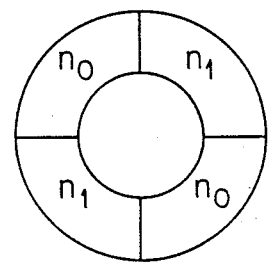

If a material is selected with the profiles according to FIGS. 6 and 7, which dissolves under the influence of suitable solvents and another is selected that is not dissolved, rods and tubes are obtained that have an extremely enlarged surface area. Alternatively, a material can also be chosen that can be partially leached to a porous structure only after an appropriate tempering treatment. The threads of the non-leachable material function, then, as a support material for the material that has been porously leached. In this way, the surface area of tubes can be considerably enlarged inside and outside. The profile of the leachable and the non-leachable material components can also be formed in such a way that, following twisting, thin, porous layers lie in spiral shape in a tube wall between solid layers consisting of support material. The profile before twisting is sketched in FIG. 11, if the material $n_0$ is leachable and the material $n_1$ is not leachable.

This is one example of how, with the described method, the material properties can be varied not only with compact cylindrical shapes, but also with tubes.

Furthermore, it is important that the method according to the invention is not limited to application to glasses. The methods can be applied with all materials in which the viscosity can be lowered in some kind of manner. This will be attainable in many cases through increasing the temperature. However, it is also possible—especially with plastics—to lower the viscosity by means of suitable solvents or other chemicals and then to twist the materials and allow them to resolidify.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by Letters Patent is:

1. A method of producing a cylindrically symmetrical body having a radial gradient of material properties, comprising:
    providing a least two rod-shaped molded bodies, said bodies being of materials which have different physical properties,
    uniting said bodies in parallel,
    lowering the viscosity of said bodies so that said bodies are temporarily converted to plastically deformable states of approximately equal viscosity while said bodies are maintained in parallel, wherein said step of lowering the viscosity of said bodies comprises thermally treating said bodies at an elevated temperature,
    thereafter twisting said bodies about a longitudinal axis so that a desired radial gradient of the material properties is achieved,
    maintaining for a limited time said twisted bodies at a temperature slightly lower than the temperature chosen for said step of thermally treating said bodies, whereby the homogeneity of said twisted bodies is improved, and resolidifying said twisted bodies.

2. The method of claim 1, wherein said maintaining step is performed after said bodies have been twisted.

3. The method of claim 1, wherein said step of lowering the viscosity of said bodies comprises adding a solvent.

4. The method of claim 1, wherein
    said step of providing at least two molded bodies comprises selecting for at least one of said bodies a material which is at least partially leachable, and leaching said material of said at least one body after twisting said bodies.

5. The method of claim 4, wherein the material selected for at least one of the bodies is entirely leachable.

6. The method of claim 1, wherein
    said step of providing at least two molded bodies comprises selecting for at least one of said bodies a material in which fluorescent ions or particles are contained.

7. The method of claim 1, wherein
    said step of providing at least two molded bodies comprises using for at least one of said bodies a material which is colored.

8. The method of claim 1, wherein
    said step of providing at least two molded bodies comprises using for at least one of said bodies a material which exhibits photochromic properties.

9. A method of making gradient index lenses using the resolidified twisted bodies produced according to claim 1, comprising:
    dividing said bodies into discs, and
    polishing said discs.

10. The method of claim 9, wherein said step of dividing comprises cutting said bodies at an angle relative to said longitudinal axis.

11. The method of claim 10, wherein said angle is 90° and said discs have parallel faces.

12. The method of claim 10, wherein said angle is such that said discs have non-parallel faces.

13. A method of producing lenses using the resolidified bodies produced according to claim 1, comprising:
    dividing said bodies into elements such that each element has at least one spherical surface.

14. A method of producing lenses using the resolidified bodies produced according to claim 1, comprising:
    dividing said bodies into elements such that each element has at least one non-spherical surface.

15. The method of claim 1 wherein said materials are inorganic glasses with different indices of refraction.

16. The method of claim 1 wherein said materials are plastics with different indices of refraction.

17. The method of claim 1 wherein said materials are organic glasses with different indices of refraction.

* * * * *